United States Patent [19]

Okabe et al.

[11] Patent Number: 5,102,862

[45] Date of Patent: Apr. 7, 1992

[54] METHOD FOR MANUFACTURING A TUNNELING JOSEPHSON ELEMENT

[75] Inventors: Yoichi Okabe; Atsuki Inoue; Hideomi Koinuma, all of Tokyo, Japan

[73] Assignee: The University of Tokyo, Tokyo, Japan

[21] Appl. No.: 567,504

[22] Filed: Aug. 15, 1990

Related U.S. Application Data

[62] Division of Ser. No. 174,760, Mar. 29, 1988.

[30] Foreign Application Priority Data

Jul. 28, 1987 [JP] Japan .............................. 62-186751

[51] Int. Cl.$^5$ .............................................. B05D 5/12
[52] U.S. Cl. ....................................... 505/1; 505/702; 505/701; 427/62; 427/63; 427/404; 427/419.2; 427/125; 427/126.3; 427/126.4; 357/5
[58] Field of Search ............................ 505/1, 702, 701; 427/62, 63, 125, 126.3, 126.4, 404, 419.2, 419.3; 357/5

[56] References Cited

U.S. PATENT DOCUMENTS 4,952,554 8/1990 Jin et al. ..................................... 505/1

FOREIGN PATENT DOCUMENTS 60-65581 4/1985 Japan ........................................ 357/5

OTHER PUBLICATIONS

Japanese Journal of Applied Physics, vol. 26, No. 5, pp. L645–L646 (May 1987).
Japanese Journal of Applied Physics, vol. 26, No. 6, pp. L1917–L1018 (Jun. 1987).
Extended Abstracts of the M.R.S.–High Temperature Superconductors, Proceedings of the Materials Research Society, pp. 169–171 (Apr. 1987).
Applied Physics Letters, vol. 51, No. 3, pp. 203–204 (Jul. 1987).
Japanese Journal of Applied Physics, vol. 26, No. 9, pp. L1443–L1444 (Sep. 1987).

*Primary Examiner*—Shrive Beck
*Assistant Examiner*—Roy V. King
*Attorney, Agent, or Firm*—Sughrue, Mion, Zinn, Macpeak & Seas

[57] ABSTRACT

A superconductive device and method for the manufacture thereof is disclosed, having a tunneling Josephson element comprising a first oxide superconductor electrode, a blocking layer consisting of a metal substantially inert to oxygen formed on the surface of the oxide superconductor, an insulating thin film layer formed on the blocking layer, and a second superconductor electrode opposing said first electrode formed on the insulating thin film.

1 Claim, 5 Drawing Sheets

FIG_1
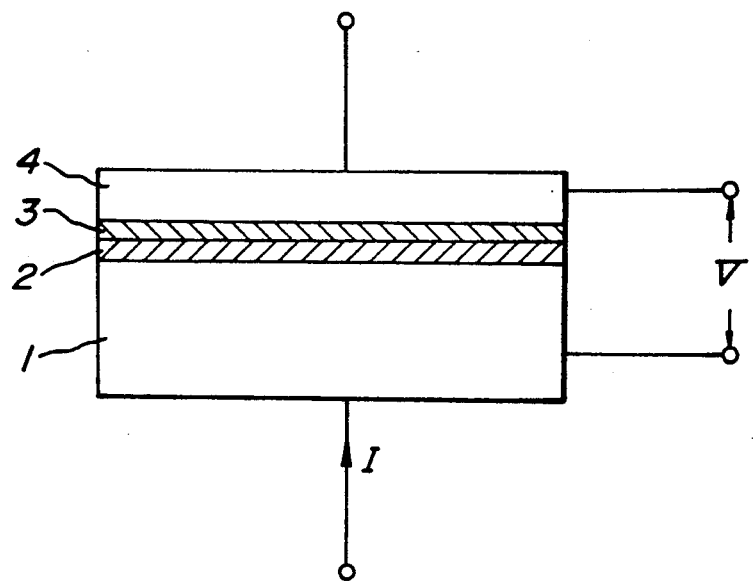
FIG_2
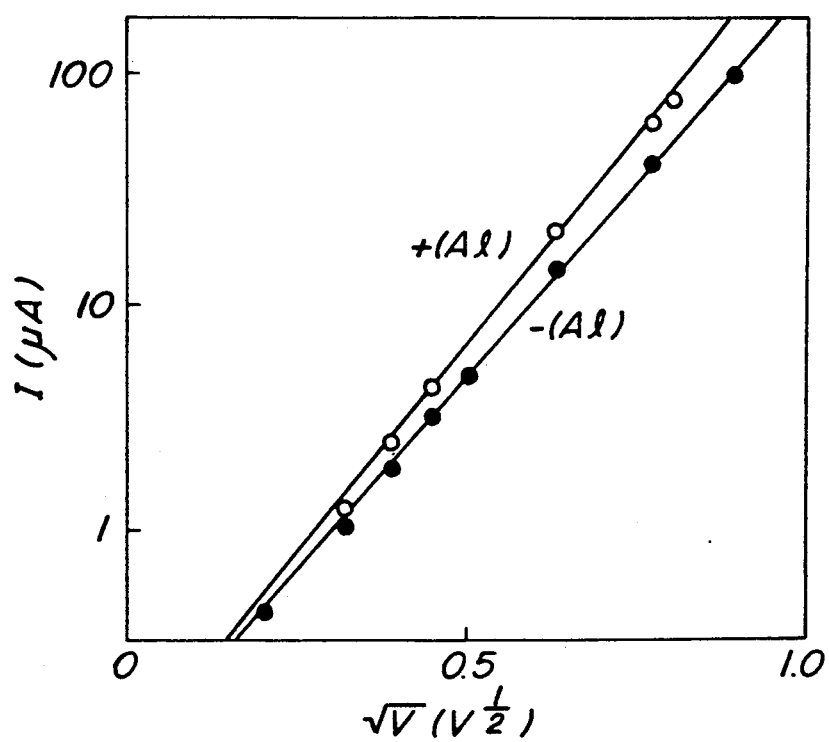

FIG_3
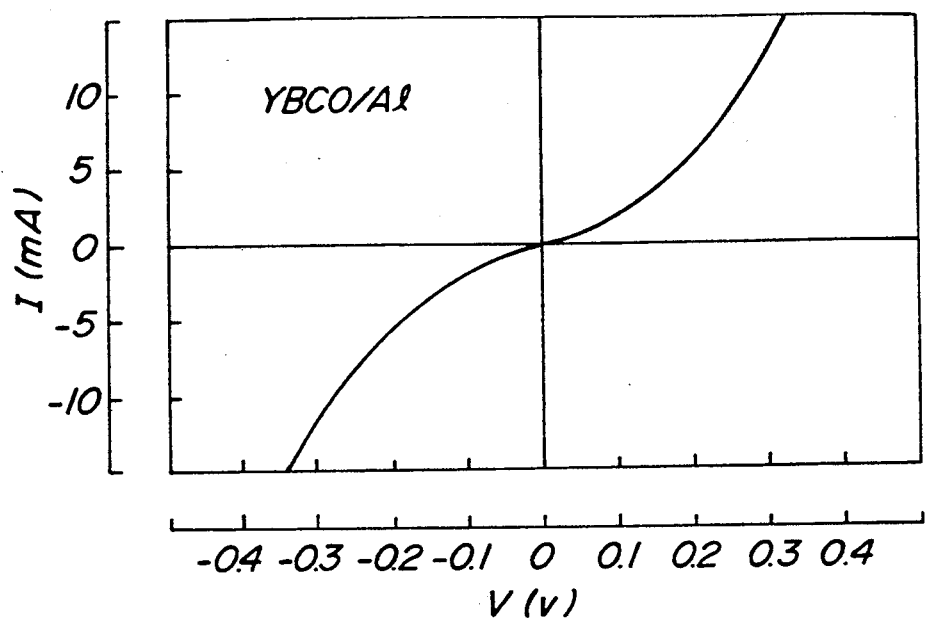
FIG_4
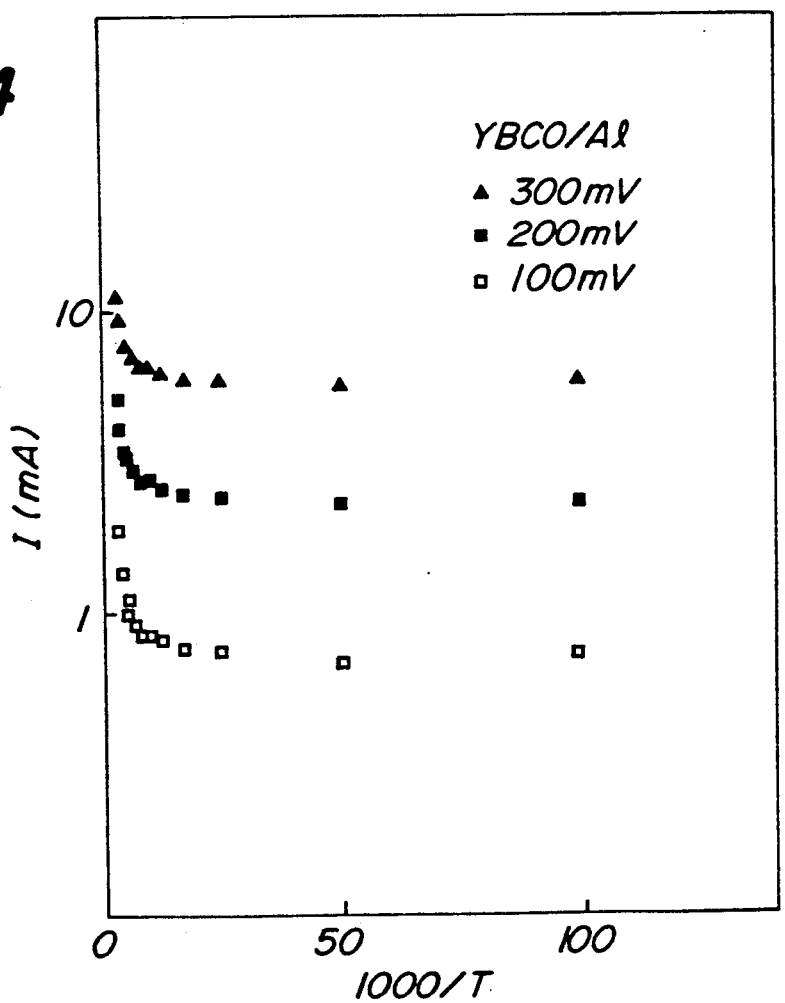

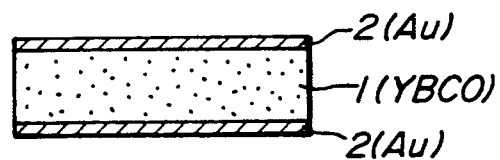
FIG._5a
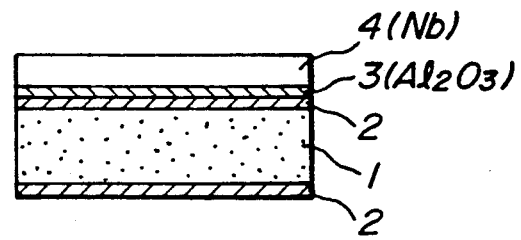
FIG._5b
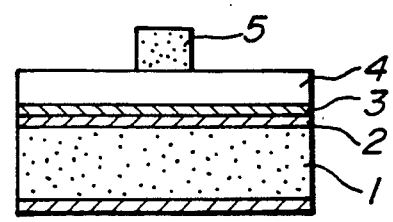
FIG._5c
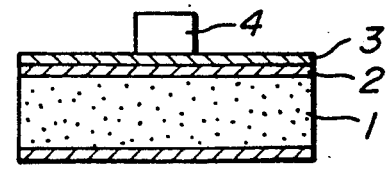
FIG._5d

FIG._6a
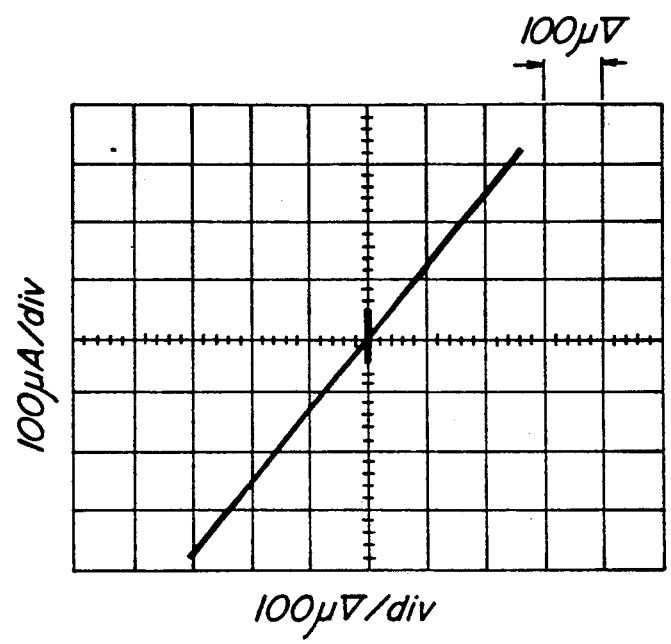
FIG._6b
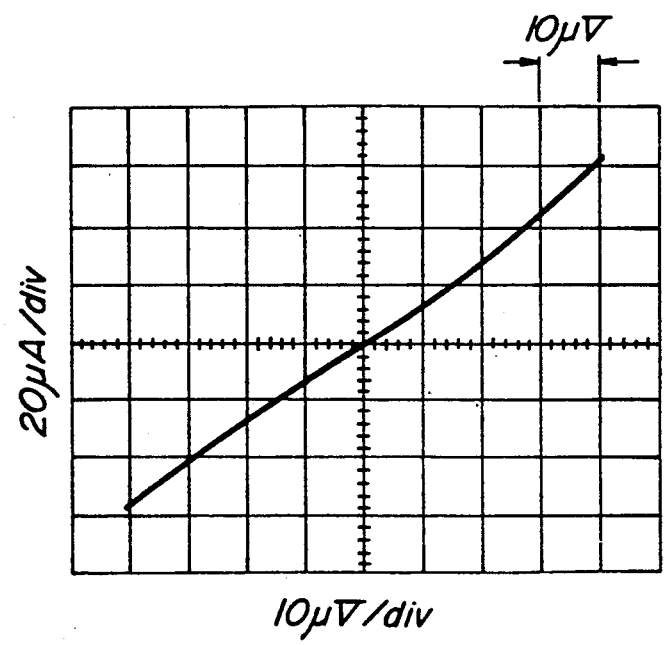

FIG_7
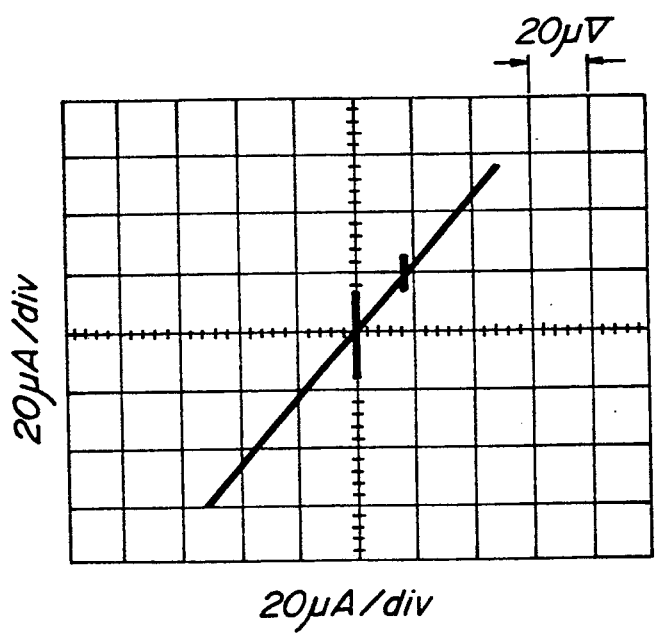

METHOD FOR MANUFACTURING A TUNNELING JOSEPHSON ELEMENT

This is a divisional application Ser. No. 174,760, filed Mar. 29, 1988.

BACKGROUND OF THE INVENTION

1. Field of the Invention

The present invention relates to a technique of forming a device with the aid of a superconductive phenomenon, particularly a technique of forming a tunneling Josephson element.

2. Related Art Statement

Prior investigators have sought to form a solid electron device such as a Josephson element with the use of a well-known superconductor such as lead, niobium, an alloy or compound thereof as an electrode material. The Josephson element with the use of these metallic superconductors is near practical use as a result of studies for last ten-odd years.

However, the critical temperature Tc of these superconductors is extremely low (e.g., the highest being an absolute temperature of 23K in case of $Nb_3Ge$), so that in order to actuate the element, it is necessary to use liquid helium. The use of liquid helium is a great obstacle for widely using a Josephson element in general. Further, an essential speed of the superconductive device is limited by an energy gap inherent to the superconductor. This energy gap is pointed out to be theoretically proportionate to the critical temperature. Therefore, the low critical temperature limits the speed of the superconductive device.

It has recently become clarified that the noted oxide superconductor such as Y-Ba-Cu-O series is operable at a relatively high temperature (more than 90K) and that the oxide superconductor has a large superconductive gap voltage ten times larger than the prior superconductor. In the above two points, the Josephson element with the use of these materials, as compared with the prior devices, is very advantageous and considered to be industrially valuable in practice. However, when the insulator as a tunnel barrier is deposited, there superconducting oxides are liable to cause a reaction at the interface between the insulator and superconducting oxides. Therefore, the superconducting characteristic on the side of the superconductor is remarkably deteriorated and becomes a large obstacle in manufacture of a device. This is confirmed to be caused due to the structure of the oxide superconductor which is liable to dissociate oxygen and to result in a chemical reaction of atoms in the insulator with oxygen in the superconductor.

SUMMARY OF THE INVENTION

An object of the invention is to improve the interface characteristics between an insulator and an oxide superconductor, and to propose a method of manufacturing a tunneling Josephson element by depositing metal which is substantially inert to oxygen on the surface of the oxide superconductor.

A second object of the invention is to provide a superconductive device having a tunneling Josephson element comprising an oxide superconductor substrate, a blocking layer formed on the surface of the oxide superconductor substrate by coating a metal substantially inert to oxygen, an insulating thin film layer formed on the blocking layer, and a second superconductor electrode coated on the opposite surface of the thin film.

Another object of the invention is to provide a method of manufacturing a superconducting device comprising the steps of forming a blocking layer by polishing the surface of an oxide superconductor substrate to a mirror surface, coating a metal substantially inert to oxygen selected from group consisting of Au, Pt, Ag and Cu onto said substrate, and forming an insulating thin film selected from the group consisting of oxide, fluoride and semiconductor on the surface of the blocking layer, and forming a second superconductor electrode on the opposite surface of the insulating thin film, thereby constructing a tunneling Josephson element between the oxide superconductor substrate and the second superconducting electrode.

BRIEF DESCRIPTION OF THE DRAWINGS

For a better understanding of the invention, reference is made to the accompany drawings, in which:

FIG. 1 is a cross-sectional view of a Josephson element formed by a method according to the invention;

FIG. 2 is an I-V characteristic view of junction of La-Sr-Cu-O oxide superconductor and Al at room temperature;

FIG. 3 is an I-V characteristic view of the resulting ohmic contact at room temperature (T=296K);

FIG. 4 is a characteristic view showing the temperature dependency of current of a YBCO/Al junction;

FIGS. 5a, 5b, 5c and 5d are manufacturing a YBCO/Au/$AlO_x$/Nb tunneling Josephson junction according to the invention;

FIGS. 6a and 6b are an I-V characteristic view of an YBCO/Au/$AlO_x$Nb tunneling junction at 4.2K according to the invention; and FIG. 7 is a characteristic view showing a dielectric voltage step on the I-V characteristic line of an YBCO/Au/$AlO_x$/Nb junction according to the invention.

DESCRIPTION OF THE PREFERRED EMBODIMENTS

A principle of the invention is to manufacture a tunneling Josephson element by preventing a reaction between an insulator film and a superconducting oxide by depositing a blocking layer consisting of a metal inert to react with oxygen on the surface of the oxide superconductor before forming the insulator thin film on the surface of the oxide superconductor, and this principle can be applied to any oxide superconductor regardless of its kind. It means that the oxide superconductor has a structure of easily dissociating oxygen, and this oxide superconductor is coated with a metal inert to react with oxygen to form a blocking layer for inactivity.

As superconductive oxides use may be made of any superconductor material obtained by using a sintering method, screen printing method, sputtering method, MBE method, CVD method (inclusive of MOCVD method) and the like. As an example of materials $$(A_{1-x}B_x)_yCu_2O_w$$

where, $x=0\sim1$, $y=2\sim4$ (preferably $y=3$), $z=1\sim4$ (preferably $z=2\sim3$), and $w=4\sim10$ (preferably a vicinity of 7).

However, instead of O (oxygen), halogen elements such as F, Cl and the like may be used. As an element A, it is selected from the group consisting of yttrium (Y), gadolinium (Gd), Ytterbium (Yb), Europium (Eu), Terbium (Tb), Dysprosium (Dy), Holmium (Ho), Erbium (Er), Thulium (Tm), Lutetium (Lu), Scandium (Sc) and other elements of Periodic Table IIIa. As an element B, it is selected from the group consisting of Radium (Ra), Barium (Ba), Strontium (Sr), Calcium (Ca), Magnesium (Mg), Beryllium (Be) of Periodic Table IIa. Particularly, as an embodiment, $Y,Ba_2Cu_3O_{7-\delta}$ is used. Further, as an element A, use may be made of lanthanide element and actinide element besides the above elements.

As insulators, it is selected from the group consisting of aluminum oxide, tantalum oxide, titanium oxide, zirconium oxide, magnesium oxide, molybdenum oxide, silicon oxide, copper oxide and silver oxide. Use may also be made of metal oxide or metal fluoride selected from the group consisting of calcium fluoride, zirconium fluoride, aluminum fluoride and magnesium fluoride and a semiconductor selected from Silicon (Si) and Germanium (Ge). These oxides can be formed by a method selected from a sputtering method, deposition method, CVD method, MBE method and the like, and can also be formed by forming a metal atom into a film by the above method, and thereafter making the film into oxide by using a method such as thermal oxidation, plasma oxidation, anode oxidation in a solution and the like. Fluoride can be formed on fluoride itself in the same manner or after filming the metal atom, it is converted into a compound with fluorine or gas including fluorine such as $CF_4$ and the like.

As a blocking layer, use may be made of stable metals selected from the group consisting of Au, Pt, Ag, Cu and the like which are comparatively hard to form oxide. Both the blocking layer and the insulating film are formed into about 10~100 Å in thickness.

A Josephson junction can be formed by depositing another superconductor material on the upper portion of the insulating film. In this case, as the upper superconductor material, use may be made of other metal superconductors (Nb, Pb and compound and alloy thereof) other than the above oxide superconductor.

An embodiment of the invention is shown in the accompanying drawings.

In FIG. 1, 1 is an Y Ba-Cu-O series oxide superconductor, 2 is a blocking layer of Gold (Au) and the like coated on the surface of the oxide superconductor, 3 is an insulating layer such as $Al_2O_3$ coated on the surface of said blocking layer, and 4 is an upper electrode such as Nb coated on the surface of said insulating thin film layer.

As shown in one embodiment of the detailed construction in FIG. 1, an interface reaction of the insulator with the superconductor can be prevented by coating the surface of the oxide superconductor with a blocking layer of Gold (Au) and the like, and a Josephson junction can be constructed without lowering superconducting characteristic on the side of the superconductor. As a result, it becomes possible to observe a superconducting current flowing between both the superconductor electrodes. Further, a constant voltage step (shappiro step) on a current-voltage characteristic is generated by radiating microwaves, and a Josephson effect of this junction can thereby be confirmed.

In case of forming a Josephson element by drawing another superconductor 4 near onto an oxide superconductor 1 through a thin insulating film 3, if the insulating film 3 is directly deposited on the oxide superconductor 1, the characteristic of the superconductor electrode is considerably deteriorated by reaction of the insulating film 3 with the oxide superconductor 1 as an electrode material so as to observe no superconductor current flow, and the resistance between both the electrodes becomes high.

On the other hand, if a coating layer 2 is formed on the surface of the oxide superconductor 1 with the use of a hard-to-oxidize metal such as Au and the like before deposition of an insulating film and thereafter the insulating film 3 is deposited thereon, it is possible to prevent direct reaction of the oxide superconductor 1 with the insulating film 3, so that a tunneling Josephson element can be composed without deteriorating the superconducting characteristic of the superconducting electrode.

According to the invention, on the surface of the oxide superconductor is formed a blocking layer by coating a stable metal element such as Au, Pt, Ag, Cu and the like which is substantially inert to oxygen, thereafter by coating one or more than one insulator of metal oxide selected from the group consisting of $Al_2O_3$, TaO, TiO, ZrO, MgO, MoO, $SiO_2$, CuO, AgO and the like or semiconductors selected from the group consisting of $CaF_2$, $ZrF_2$, $AlF_3$, MgF and the other metal fluoride. Direct reaction of the oxide superconductor 1 with the insulating film layer 3 is thus prevented, and as a result, deterioration of the superconducting characteristic of the oxide superconductor can be prevented, so that it is very advantageous to construct a tunneling Josephson element in industry.

According to the method of the invention, it is possible to manufacture various superconductive devices composed of Josephson elements with the use of a high temperature oxide superconductor. An example is mentioned in detail. That is, the present invention is extremely useful for a highly sensitive fluxmeter, analog applied machinery and tools such as an EHF detector, superconductive high speed computer logic IC circuit, and digital applied machinery and tools such as an memory IC circuit.

EXAMPLE

(1) Object of Experiment

Recently, high temperature superconductors including Y-Ba-Cu-O have attracted attention, and active study has been made. The high temperature superconductor is naturally important for high temperature applications, but viewed from an electronic application, more particularly a computer, it is rather important to recognize that the energy gap property estimated from its high critical temperature (Tc) is large. That is, a Josephson circuit is operated by driving a flux quantum, but its driving capacity is proportionate to the output voltage of a driver, and the voltage is limited by a gap voltage. Therefore, if a Josephson junction is fabricated with a material having a large energy gap, the limitation due to such an essential delay time can largely be mitigated.

In view of the above, the inventors have tried to form a tunneling Josephson junction with the use of an oxide superconductor. It is ideal to realize tunneling Josephson junctions in the form of a laminated thin film of oxide superconductor at the end. However, at present, there is no technique of forming a thin film of oxide superconductor of good quality, so that the characteristics of an oxide superconductor formed by sintering as one superconductor are determined by using Niobium (Nb) as the other superconductor.

(2) Characteristic of LSCO/Al junction

First of all, an experiment was conducted by using an La-Sr-Cu-O system oxide superconductor (hereinafter referred to as "LSCO"). A sintered body as used is made by mixing a powder of $La_2(CO_3)_3$, $SrCO_3$, CuO in ethanol, reacting at 1,000° C. for 10 hours, pressing into pellets, and sintering at 1,000° C. for 6 hours. As a result of measurement by the ICP method, the composition was La 1.58, Sr 0.22, $CuO_{4-x}$, on-set of the critical absolute temperature (Tc) was 45K, and the resistance become zero at 35K. The surface of sintered body was polished by using water and an $SiO_2$ powder before forming an element. A complete mirror face cannot be obtained because of the presence of cavities.

As a method of forming a tunnel barrier, the process for manufacturing a Nb/Al tunnel junction was employed, an aluminum film was formed on LSCO, and the surface was naturally oxidized to form an element as a trial. However, the thus obtained element shows remarkably high resistance, and is far from a Josephson element.

In order to find the cause of this high resistance, the I-V characteristics of the LSCO and aluminum film junction was examined. The junction was formed by depositing aluminum (Al) on LSCO by resistance heating. The size of the junction was 600 μm square with the use of a metal mask. In order to obtain a contact of low resistance with LSCO, Au was deposited on the back side of a pellet.

FIG. 2 plots an example of the I-V characteristic of the thus obtained LSCO/Al junction at room temperature. That is, the current is proportionate to an index of a square root of a voltage. As a mechanism of electric conductivity showing such an I-V characteristic, Schottky emission and Frenkel pool emission are known, and electric conductivity through an insulator thin film is shown. Voltage (V) dependency of current (I) is given by $$I \propto e \times p(e \sqrt{eV/(4 \cdot \pi \epsilon d))/kT} \quad (1)$$

and $$I \propto V e \times p(e \sqrt{eV/(\pi \epsilon d))/kT} \quad (2)$$

where, e is a charge mass, z is a dielectric constant, d is a film thickness, k is Boltzmann's factor, and T is an absolute temperature. The results of FIG. 2 more concise with (1) than (2).

FIG. 2 is a graph showing the I-V characteristic of a La-Sr-Cu-O series oxide superconductor junction at room temperature, and in FIG. 2, a "+(Al)" curve shows an aluminum anode, and a "-(Al)" curve shows an aluminum cathode.

10 KHz of junction capacitance was measured, and a value of about 1.1 nF was obtained, but no dependency upon the direct current bias voltage was observed. From this fact, it was found that no depletion layer was present.

considered from the above result, it is understood that there is formed a fairly thick insulating layer between LSCO and Al. When the inclination of the straight line and the value of the capacitance are used, a thickness d of the insulating layer and a specific dielectric constant $\epsilon_r$ can be assumed, and on the assumption of (1), d=25 nm, and $\epsilon_r=7.5$.

(3) CHARACTERISTIC OF YBCO/AL JUNCTION

Next, an experiment was conducted by using Y-Ba-Cu-O oxide sintered body (hereinafter referred to as "YBCO"). An YBCO sintered body was formed by mixing powders of $Y_2O_3$, $BaCO_3$ and CuO in ethanol, reacting the mixture at 900° C. for 12 hours, and further sintering at 950° C. for 72 hours. The composition ratio of Y, Ba and Cu is 1:2:3. As a result of measuring resistance, the resistance of this specimen became zero at an absolute temperature of 83K. Before forming an oxide superconductor device, the specimen surface is polished with $Al_2O_3$ of 0.2 μm in grain diameter. The specimen surface after polishing became a mirror surface having comparatively less depletion.

On the polished YBCO was deposited aluminum (Al) by resistance heating, and a contact junction was formed. A junction area was made 800 μm ×1,200 μm by metal mask. Further, at the rear surface of the specimen was formed an ohmic contact with the use of gold (Au). FIG. 3 is a graph showing the I-V characteristic of the obtained junction at room temperature (T=296K). The case of making the Al side pulse (+) and the case of making it minus (−) show substantially symmetrical characteristics, and the resistance in the vicinity of the starting point became about 40 Ω. Further, a bend is observed in the I-V characteristic, and it is estimated that an insulating layer is formed on the YBCO/Al interface.

Next, the temperature change of the I-V characteristic was measured. The results are shown in FIG. 4. FIG. 4 is a diagram showing temperature dependency of current of an YBCO/Al junction. In FIG. 4, there is no temperature change at less than about 50K, and within this temperature range a current is considered to flow through the a insulating film in tunneling mechanism. Resistance at around the starting point in this time became about 200 Ω.

(4) Trial manufacture of YBCO/Au/AlO$_x$/Nb tunneling Josephson element

As stated above, the YBCO/Al contact becomes highly resistive due to formation of the insulating layer on the interface between YBCO and Al. Therefore, the prior technique of forming a Nb/Al/AlO$_x$ junction cannot be used as it is. Hence, the inventors recognizing that the YBCO/Au contact is ohmic, manufactured tunneling Josephson element of YBCO/Au/AlO$_x$Nb structure by preventing a reaction of Al with YBCO by a method of depositing Au a thin film of before deposition of Al.

FIG. 5 shows a manufacturing process. First of all, Au (2) is deposited on both of the polished surfaces of an YBCO sintered body (1). Au in the rear is used as an ohmic electrode. A film thickness of Au deposited on the surface is 7 nm.

Next, in another vacuum chamber, Al (3) and Nb are successively deposited by an electron beam deposition method. Film thicknesses are 6 nm and 100 nm, respectively. Before depositing Nb, the surface of Al is oxidized in pure oxygen having pressure of 3 torr for 30 minutes, and an oxide film $(Al_2O_3)_3$ is obtained. Finally, the obtained resist 5 at the junction portion is patterning and Nb (4) of the upper electrode is etched by RIE with the use of CF$_4$ gas including 5% of oxygen (O$_2$). The junction area is 800 μm×800μm.

FIG. 6 is a graph showing the current voltage characteristic measured by a 4 terminal method bonding the formed junction with the use of Indium (In). FIG. 6 is the I-V characteristic of a tunneling junction of YBCO/Au/AlO$_x$/Nb at an absolute temperature of 4.2K, and the junction area is 800=800μm$^2$. FIG. 6(a) is a graph of the superconductive current, in which the critical current density is J=7×10$^{-3}$A/cm$^2$, the scale of coordinate is 100μA/div, and the scale of abscissa is 100μV/div. The measured temperature is 4.2K. The superconducting current of 50 μA is observed in the vicinity of the starting point. On the assumption that a uniform current flows to the whole junction, the superconducting current density becomes about 0.007A/cm$^2$. Further, hysteresis characteristic to a tunneling junction is observed. This histeresis is not observed in point contact junction with the use of the prior oxide superconductor.

However, the leak current of less than gap voltage is very large, the I-V characteristic shows a slightly projected bend below, and a clear gap structure cannot be observed. It is considered that flatness of the polished YBCO surface is not good, and a barrier layer is not uniformly formed. Therefore, the possibility of the existence of many point junctions in parallel to the tunneling junction cannot be denied.

Next, FIG. 7 shows the I-V characteristic diagram when the element is irradiated by microwaves. FIG. 7 shows a high frequency dielectric voltage step on the I-V characteristic line of an YBCO/Au/AlO$_x$/Nb tunneling junction. Coordinate is 20μA/div, and abscissa is 20μA/div. Frequency of the irradiated microwave is 8.3 GHz. Shappiro step was observed on the I-V characteristic. The relation between the constant voltage step V step and the frequency f of the irradiated microwave satisfies the following equation (3).

$$V_{step} = n (h/23)f \quad (3)$$

where, n is an integer, h is plank's constant, and e is a charge mass. It was confirmed from the above that this junction becomes a Josephson junction by the tunneling of bare electron.

(5) Conclusion

Considering that a large energy gap of the oxide superconductor having high critical temperature is important for improving driving capacity of the Josephson circuit, the inventors tried to form a tunneling Josephson junction on the surface of an oxide superconductor of a sintered body. Hitherto, in order to investigate the possibility of replacing the lower electrode of a Nb/Al/AlO$_x$/Nb junction of high quality with the use of Nb for an oxide superconductor, LSCO/Al, YBCO/Al contacts were first examined in the first place, and as a result, it was found that a fairly thick insulating layer is formed at the interface between LSCO and Al. From the measurement result of the I-V characteristic and C-V characteristic, it is assumed that the thickness of the insulating layer is d=25 nm, and the specific dielectric constant is ε=7.5. There was further obtained an experimental result suggesting the formation of an insulating layer on the YBCO/Al interface. In order to prevent the formation of the above insulating layer on the interface between the oxide superconductor and Al, a tunneling Josephson element of YBCO/Au/AlO$_x$/Nb structure was manufactured for trial by using a method of coating the surface of an oxide superconductor with thin gold film (Au), and the superconducting current and hysteresis were observed on the I-V characteristic curve. The formation of a Josephson junction by tunneling of bare electron was also confirmed by observing the constant voltage step upon irradiating with microwaves. However, a large leak current exists in the thus obtained junction. This is because of poor flatness of the surface of the sintered body, and the possibility of existence of point-like junctions other than a tunneling junction cannot be denied.

Although the invention has been described with a certain degree of particularity, it is understood that the present disclosure has been made only by way of example and that numerous changes in details of construction and the combination and arrangement of parts may be resorted to without departing from the scope of the invention as hereinafter claimed.

What is claimed is:

1. A method of manufacturing a superconductive device comprising the steps of:

polishing the surface of a first oxide superconductor electrode to a mirror surface;

coating a metal substantially inert to oxygen selected from the group consisting of Au, Pt, Ag and Cu onto the polished surface of said oxide superconductor electrode to form a blocking layer thereon, forming an insulating thin film selected from the group consisting of aluminum oxide, tantalum oxide, titanium oxide, zirconium oxide, magnesium oxide, molybdenum oxide, silicon oxide, copper oxide, silver oxide, calcium oxide, aluminum fluoride, magnesium fluoride, silicon and germanium on the surface of the blocking layer; and forming a second superconductor electrode opposing said first electrode on the surface of the insulating thin film, wherein the blocking layer has a thickness of from about 10 to 100 angstroms and the insulating film has a thickness of from about 10 to 100 angstroms, to thereby obtain a tunneling Josephson element between the first oxide superconductor electrode and the opposing second superconductor electrode.

* * * * *